United States Patent [19]

Tsukamoto

[11] Patent Number: 5,440,567
[45] Date of Patent: Aug. 8, 1995

[54] COMPLEMENTARY BOUNDARY-SCAN CELL

[75] Inventor: Koichi Tsukamoto, Sagamihara, Japan

[73] Assignee: Kabushiki Kaisha Toshiba, Kawasaki, Japan

[21] Appl. No.: 208,833

[22] Filed: Mar. 11, 1994

[30] Foreign Application Priority Data

Mar. 11, 1993 [JP] Japan .................................. 5-051053

[51] Int. Cl.⁶ .............................................. G06F 11/00
[52] U.S. Cl. ................................. 371/22.3; 371/22.1; 371/22.5; 371/22.6
[58] Field of Search .................... 371/22.1, 22.3, 22.4, 371/22.5, 22.6, 25.1; 324/528, 537, 555

[56] References Cited

U.S. PATENT DOCUMENTS

| | | | |
|---|---|---|---|
| 5,150,044 | 9/1992 | Hashizume et al. | 324/158 |
| 5,270,642 | 12/1993 | Parker | 324/158 |
| 5,281,864 | 1/1994 | Hahn et al. | 307/272.2 |
| 5,343,478 | 8/1994 | James et al. | 371/22.3 |

OTHER PUBLICATIONS

IEEE Std. 1149.1-1990, pp. 1-1 to 1-5, May 21, 1990, "IEEE Standard Test Access Port and Boundary-Scan Architecture".

*Primary Examiner*—Emanuel T. Voeltz
*Assistant Examiner*—Patrick J. Assouad
*Attorney, Agent, or Firm*—Oblon, Spivak, McClelland, Maier & Neustadt

[57] ABSTRACT

A complementary boundary-scan cell arrangement includes a plurality of system input terminals supplied with signals from the system side, a corresponding number of scan input terminals, a corresponding number of registers supplied with signals inputted to the system input terminals or the scan input terminals and adapted for holding them, a corresponding number of system output terminals supplied with the signals held by the registers and adapted for outputting them to the system side, and a corresponding number of scan output terminals supplied with the signals held by the registers and adapted for outputting them for scan. This complementary boundary-scan cell arrangement further includes a corresponding number of first to fourth multiplexers. The first and second multiplexers to permit switching the connection relationships between the respective input terminals and the registers. The third and fourth multiplexers to permit switching the connection relationships between the registers and the respective output terminals.

5 Claims, 7 Drawing Sheets

FIG. 1

| MODE | | | MODE | P/S | SHIFT/LOAD | NOTE |
|---|---|---|---|---|---|---|
| NORMAL OPERATION | | | 0 | × | × | NORMAL MODE |
| TEST | NO FAULT (PARALLEL) | LOAD | 1 | 0 | 0 | USE SCAN CELL OF OWN SYSTEM |
| | | SHIFT | 1 | 0 | 1 | |
| | FAULT (SINGLE) | LOAD | 1 | 1 | 0 | SUBSTITUTE SCAN CELL OF OTHER SYSTEM |
| | | SHIFT | 1 | 1 | 1 | |

| MODE | | | MODE | P/S | SHIFT/LOAD | NOTE |
|---|---|---|---|---|---|---|
| NORMAL OPERATION | | | 0 | 0 | × | NORMAL MODE |
| TEST | NO FAULT (PARALLEL) | LOAD | 1 | 0 | 0 | USE SCAN CELL OF OWN SYSTEM |
| | | SHIFT | 1 | 0 | 1 | |
| | FAULT (SINGLE) | LOAD | 1 | 1 | 0 | SUBSTITUTE SCAN CELL OF OTHER SYSTEM |
| | | SHIFT | 1 | 1 | 1 | |

| MODE | | MODE | | | SHIFT/LOAD | NOTE |
|---|---|---|---|---|---|---|
| | | | B | A | | |
| NORMAL OPERATION | | 0 | X | X | X | NORMAL MODE |
| TEST | NO FAULT (PARALLEL) | LOAD | 1 | 0 | 0 | 0 | USE SCAN CELL OF OWN SYSTEM $\begin{pmatrix} X\ IN \rightarrow L\ SYSTEM \rightarrow X\ OUT \\ Y\ IN \rightarrow M\ SYSTEM \rightarrow Y\ OUT \\ Z\ IN \rightarrow N\ SYSTEM \rightarrow Z\ OUT \end{pmatrix}$ |
| | | SHIFT | 1 | 0 | 0 | 1 | |
| | FAULT (SINGLE) | LOAD | 1 | 0 | 1 | 0 | SUBSTITUTE SCAN CELL OF OTHER SYSTEM $\begin{pmatrix} X\ IN \rightarrow N\ SYSTEM \rightarrow X\ OUT \\ Y\ IN \rightarrow L\ SYSTEM \rightarrow Y\ OUT \\ Z\ IN \rightarrow M\ SYSTEM \rightarrow Z\ OUT \end{pmatrix}$ |
| | | SHIFT | 1 | 0 | 1 | 1 | |
| | FAULT (SINGLE) | LOAD | 1 | 1 | 0 | 0 | SUBSTITUTE SCAN CELL OF OTHER SYSTEM $\begin{pmatrix} X\ IN \rightarrow M\ SYSTEM \rightarrow X\ OUT \\ Y\ IN \rightarrow N\ SYSTEM \rightarrow Y\ OUT \\ Z\ IN \rightarrow L\ SYSTEM \rightarrow Z\ OUT \end{pmatrix}$ |
| | | SHIFT | 1 | 1 | 0 | 1 | |

| MODE | | | MODE | B | A | SHIFT/LOAD | NOTE |
|---|---|---|---|---|---|---|---|
| NORMAL OPERATION | | | 0 | 0 | 0 | X | NORMAL MODE |
| TEST | NO FAULT (PARALLEL) | LOAD | 1 | 0 | 0 | 0 | USE SCAN CELL OF OWN SYSTEM |
| | | SHIFT | 1 | 0 | 0 | 1 | |
| | FAULT (SINGLE) | LOAD | 1 | 0 | 1 | 0 | SUBSTITUTE SCAN CELL OF OTHER SYSTEM |
| | | SHIFT | 1 | 0 | 1 | 1 | |
| | FAULT (SINGLE) | LOAD | 1 | 1 | 0 | 0 | SUBSTITUTE SCAN CELL OF OTHER SYSTEM |
| | | SHIFT | 1 | 1 | 0 | 1 | |

COMPLEMENTARY BOUNDARY-SCAN CELL

BACKGROUND OF THE INVENTION

This invention relates to a complementary boundary-scan cell, and more particularly to a complementary boundary-scan cell in which there exist boundary-scan paths of a plurality of systems within the same chip.

Figure 10:
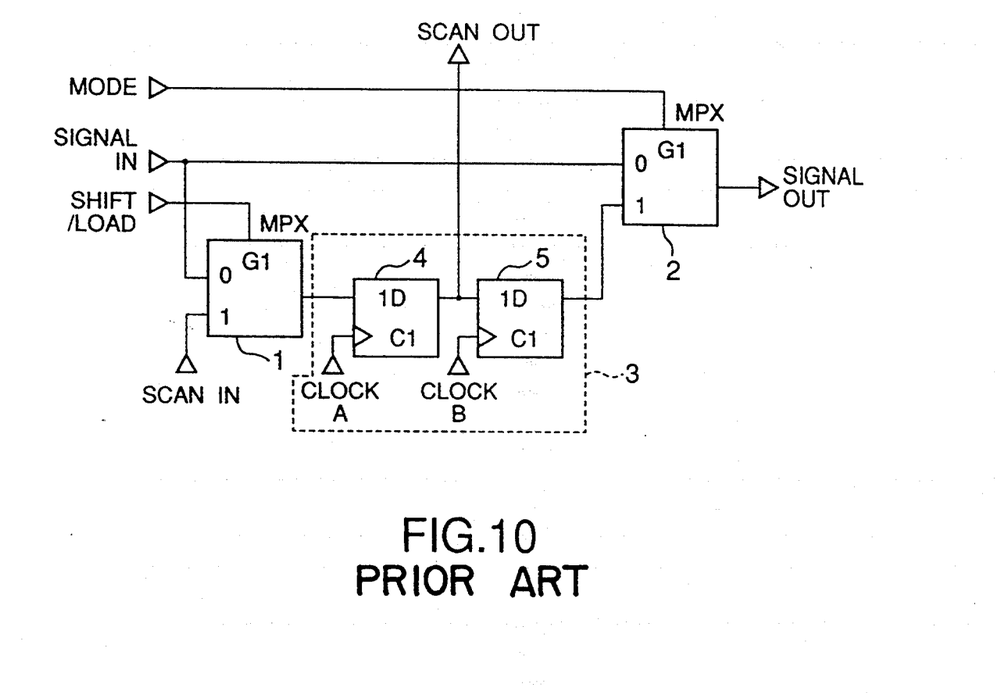
FIG. 10 is a circuit diagram showing the configuration of a conventional complementary boundary-scan cell.

As a conventional boundary-scan cell, there is a boundary-scan cell, e.g., disclosed in FIG. 1—1 of IEEE Std. 1149.1-1990, IEEE Standard Test Access Port and Boundary-Scan Architecture, p. 1–4. This boundary-scan cell comprises, as shown in FIG. 10, two multiplexers 1 and 2, and a scan register 3 including two D-type flip-flops 4 and 5.

In the normal operation mode, the Mode signal of logic "0" level is inputted to the control-terminal G1 of the multiplexer 2, and signals inputted from the input-port Signal-in are passed through the multiplexer 2 and are outputted to the exterior through the output-port Signal-out.

When this boundary-scan cell is in the test mode, the Mode signal is caused to be at logic "1" level.

When the boundary-scan cell is in the load mode, the Shift/load signal of logic "0" level is inputted to multiplexer 1, and a signal inputted from input-port Signal-in is inputted to data terminal of D-type flip-flop 4 of scan register 3 through multiplexer 1. When Clock A is inputted to clock terminal of D-type flip-flop 4, the signal inputted to the D-type flip-flop 4 is outputted and is transferred from the output-port Scan-out to the boundary-scan cell of the succeeding stage. In this way, the signals inputted from the exterior are sequentially transferred so that it reaches a plurality of boundary-scan cells arranged over the entirety of the system.

When the boundary-scan cell is in the shift mode, the Shift/load signal of logic "1" level (shift mode level) is inputted to multiplexer 1. A signal from input-port Scan-in is inputted to D-type flip-flop 4 of scan register 3 through multiplexer 1, and is outputted to the boundary-scan cell of the succeeding stage through output-port Scan-out at the timing when Clock A is given.

When signals are sequentially transferred to the boundary scan cell of the succeeding stage in this way, there results the state where the same signal is held on the output node of D-type flip-flop 4 of each scan register. In the scan register 3 of each boundary-scan cell, the signal held on the output node of D-type flip-flop 4 is outputted to the multiplexer 2 through D-type flip-flop 5 at the timing when Clock B is delivered to the D-type flip-flop 5. At this time, multiplexer 2 is supplied with the Mode signal of logic "1" level. Thus, a signal is outputted to the output-port Signal-out.

However, in the conventional boundary-scan cell, when there is at least one stuck fault such that, e.g., any signal line is short-circuited with power supply voltage VDD or ground voltage VSS, even if the internal logic circuit to be tested is normal and therefore operates non-defectively in the normal operation mode, it might be disadvantageously judged as defective at the time of testing the boundary-scan cell.

SUMMARY OF THE INVENTION

Accordingly, an object of this invention is to provide a complementary boundary-scan cell having higher tolerance with respect to faults and capable of carrying out reasonable judgment.

In accordance with this invention, there is provided a complementary boundary-scan cell comprising: m (m is an integer equal to 2 or more) number of system input terminals adapted so that signals are inputted from the system side thereto; m number of scan input terminals adapted so that signals are inputted thereto for scan; m number of registers supplied with the signals inputted to the system input terminals or the scan input terminals and adapted for holding them; m number of system output terminals supplied with the signals held by the registers and adapted for outputting them to the system side; m number of scan output terminals supplied with the signals held by the registers and adapted for outputting them for scan; m number of first multiplexers provided between the system input terminals and the registers and capable of switching the connection relationship between the system input terminals and the registers; m number of second multiplexers provided between the scan input terminals and the registers and capable of switching the connection relationship between the scan input terminals and the registers; m number of third multiplexers provided between the registers and the system output terminals and capable of switching the connection relationship between the registers and the system output terminals; and m number of fourth multiplexers provided between the registers and the scan output terminals and capable of switching the connection relationship between the registers and the scan output terminals, m number of paths connecting the system input terminals, the first multiplexers, the registers, the fourth multiplexers, and the scan output terminals being permitted to be arbitrarily switched, m number of paths connecting the scan input terminals, the second multiplexers, the registers, the third multiplexers, and the system output terminals being permitted to be arbitrarily switched.

In the case where there is no fault in m number of paths, a scheme is employed such that the operation mode is caused to be parallel mode both in load mode and in shift mode to transfer signals in parallel, while in the case where there is a fault in any path, a fault-free path is substituted for the faulty path, thus making it possible to transfer signals.

DESCRIPTION OF THE PREFERRED EMBODIMENTS

Respective preferred embodiments of this invention will now be described with reference to the attached drawings. Respective embodiments include a plurality of systems of boundary-scan paths such that when a boundary-scan cell of a certain system is faulty, a boundary-scan cell of any other system is used, thus making it possible to carry out tests.

Figure 1:
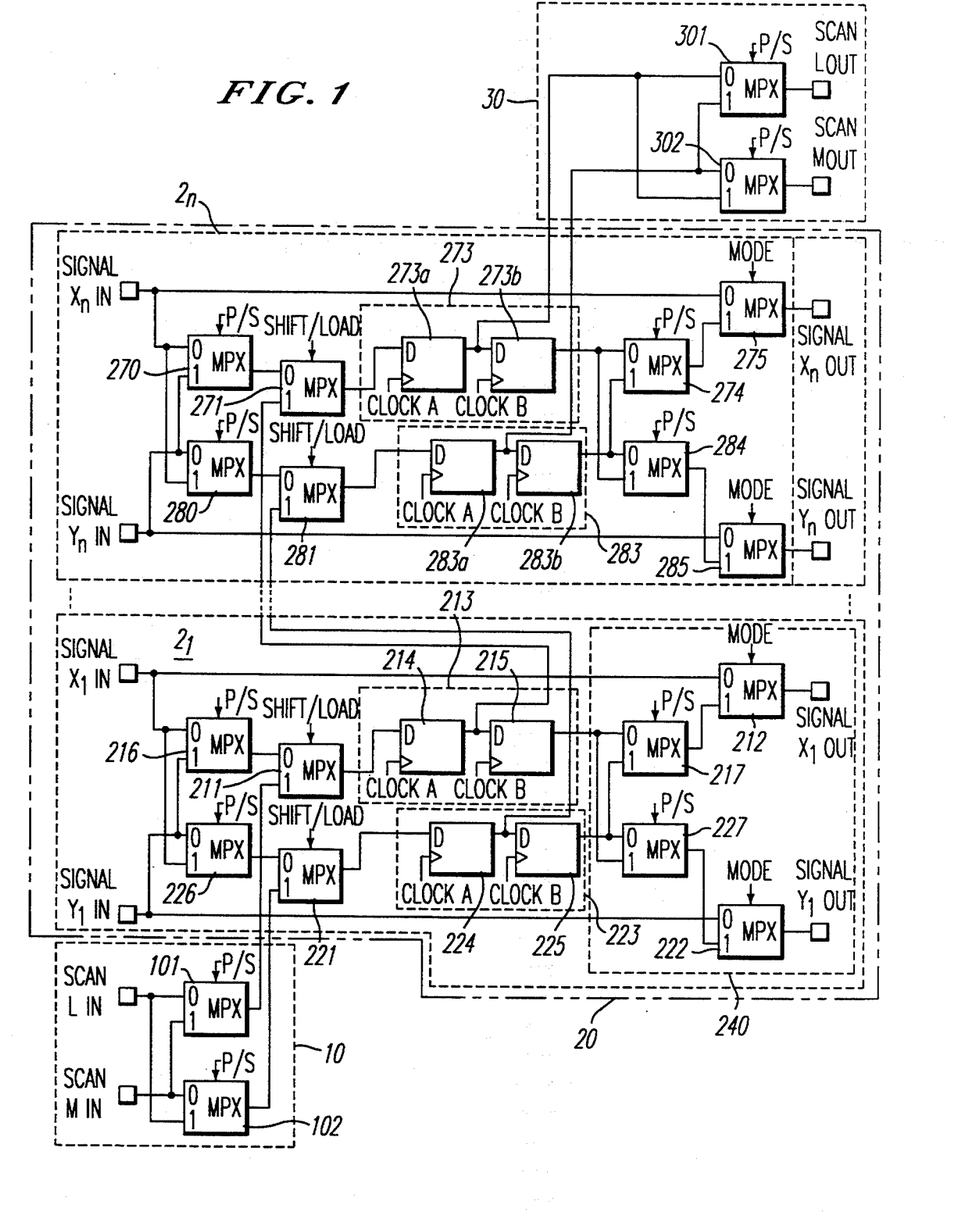
FIG. 1 is a circuit diagram showing the configuration of a complementary boundary-scan cell according to a first embodiment of this invention.

The configuration of a complementary boundary-scan cell arrangement according to a first embodiment of this invention is shown in FIG. 1. In this embodiment, two systems of boundary-scan paths are provided within the same chip, and the complementary boundary-scan cell arrangement comprises a boundary scan path input switching section 10, a group of complementary boundary-scan cells 20, and a boundary-scan path output switching section 30.

The boundary-scan path input switching section 10 includes multiplexers 101 and 102 for switching and outputting data inputted from boundary-scan path input terminals Scan-Lin and Scan-Min of two systems at the time of boundary-scan test.

When this complementary boundary-scan cell arrangement is in parallel mode, a control signal P/S of logic "0" level is given. Thus, multiplexer 101 is supplied with data inputted from boundary-scan input terminal Scan-Lin to output it, multiplexer 102 is supplied with data inputted from boundary-scan path input terminal Scan-Min to output it. Data outputted from the multiplexers 101 and 102 are respectively delivered to multiplexers 211 and 221 of a first stage complementary boundary scan cell 21 of the group of complementary boundary scan cells 20.

When this complementary boundary-scan cell arrangement is in single mode, a control signal P/S of logic "1" level is delivered to multiplexers 101 and 102. Thus, multiplexer 101 is supplied with data inputted from boundary-scan path input terminal Scan-Min to output it, and multiplexer 102 is supplied with data inputted from boundary-scan path input terminal Scan-Lin to output it.

The group of boundary-scan cells 20 include n number of boundary-scan cells 21 to 2n of the same structure.

Among boundary-scan paths Scan-L and Scan-M of two systems, signal lines corresponding to the boundary-scan path Scan-L are Signal-X1, Signal-X2, ..., Signal-Xn, and signal lines corresponding to boundary-scan path Scan-M are Signal-Y1, Signal-Y2, ..., Signal-Yn.

The complementary boundary-scan cell 21 comprises, between input terminals Signal-Xlin and Signal-Ylin and output terminals Signal-Xlout and Signal-Ylout of two systems, multiplexers 216 and 226, and 211 and 221, a scan register 213 comprised of D-type flip-flops 214 and 215, a scan register 223 comprised of D-type flip-flops 224 and 225, and multiplexers 217 and 227, and 212 and 222.

Among these circuit components, multiplexers 216 and 226, and multiplexers 217 and 227 serve to carry out selective switching between boundary-scan paths Scan-L and Scan-M of two systems. As components of a boundary-scan cell belonging to the system of the boundary-scan path Scan-L, there are provided multiplexer 211, scan register 213 and multiplexer 212. Further, as components of a boundary scan cell belonging to the system of the boundary-scan path Scan-M, there are provided multiplexer 221, scan register 223 and multiplexer 222.

When a control signal P/S of logic "0" level is given, multiplexer 216 is supplied with a signal from input terminal Signal-Xlin to output it to multiplexer 211, and multiplexer 226 is supplied with a signal from input terminal Signal-Ylin to output it to multiplexer 221.

The multiplexers 211 and 221 are operative so that when a control signal Shift/Load of logic "1" level is inputted, they are supplied with signals for scan outputted from multiplexers 101 and 102 of the above-described boundary-scan path input switching section 10 to respectively output signals to scan registers 213 and 223, while when a control signal Shift/Load of logic "0" level is inputted, they are supplied with signals outputted from multiplexers 216 and 226 to respectively output signals to the scan registers 213 and 223.

The scan registers 213 and 223 are such that signals delivered from multiplexers 211 and 221 are respectively inputted from D-type flip-flops 214 and 224. The D-type flip-flops 214 and 224 are such that when supplied with Clock A, they hold signals inputted at that timing on the output nodes. D-type flip-flops 215 and 225 output signals held on the output nodes of the D-type flip-flops 214 and 224 when Clock B is given.

When a control signal P/S of logic "0" level is inputted, multiplexer 217 is supplied with a signal outputted from scan register 213, and multipexer 227 is supplied with a signal outputted from scan register 223. In contrast, when control signal is at logic "1" level, the multiplexer 217 is supplied with a signal outputted from scan register 223, and multiplexer 227 is supplied with a signal outputted from scan register 213.

When the Mode signal is at logic "0" level, multiplexer 212 is supplied with a signal inputted from input terminal Signal-Xlin to output it from output terminal Signal-Xlout to the exterior, and multiplexer 222 is supplied with a signal inputted from input terminal Signal-Ylin to output it from output terminal Signal-Ylout to the exterior. In contrast, when the Mode signal is at logic "1" level, multiplexer 212 is supplied with a signal outputted from multiplexer 217 to output it from output terminal Signal-Xlout to the exterior, and multiplexer 222 is supplied with a signal outputted from multiplexer 227 to output it from output terminal Signal-Ylout to the exterior.

Other boundary-scan cells 22 to 2n also include the same structure as that of such complementary boundary-scan cell 21. Output nodes of D-type flip-flops 214 and 224 of the complementary boundary-scan cell 21 are connected to a complementary boundary-scan cell 22 of the succeeding stage (not shown). When complementary boundary-scan cell 21 of the first stage is taken as an example, destination of connection corresponds to one input terminal of multiplexers 211 and 221. As stated above, output nodes of D-type flip-flops of scan registers of a complementary boundary-scan cell 2(i-1) of the preceding stage are connected to one input terminal of multiplexers of a complementary boundary-scan cell 2i of the succeeding stage. Output nodes of D-type flip-flops that scan registers of a complementary boundary-scan cell 2(n-1) of the (n-1)-th stage (not shown) are respectively connected to one input terminal of multiplexers 271 and 281 of the final stage of complementary boundary-scan cell 2n. Output nodes of D-type flip-flops 273a and 283a of scan registers 273 and 283 of the complementary boundary-scan cell 2n are respectively connected to one input terminal of multiplexers 301 and 302 of the boundary-scan path output switching section 30.

The boundary-scan path output switching section 30 includes, as stated above, multiplexers 301 and 302, which operate so that when a control signal P/S of logic "0" level is inputted, they are respectively supplied with signals outputted from D-type flip-flops 273a and 283a of the complementary boundary-scan cell 2n, while when a control signal P/S of logic "1" level is inputted, they are respectively supplied with signals outputted from D-type flip-flops 283a and 273a in a manner opposite to the above.

Figure 2:
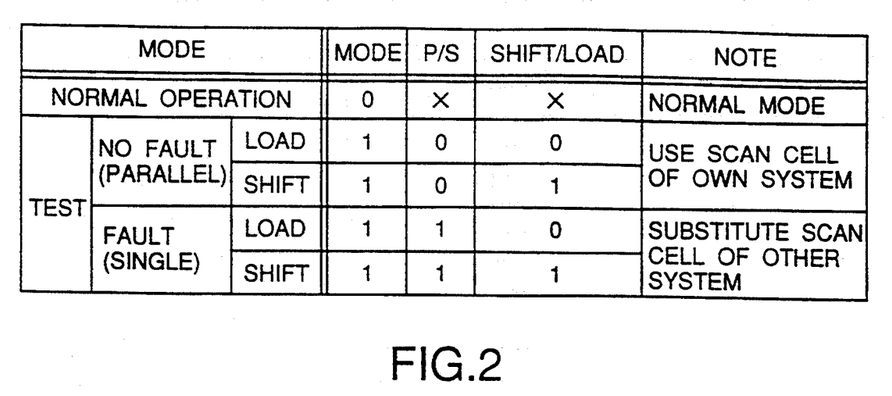
FIG. 2 is an explanatory view showing the relationship between operation modes and logic levels of respective control signals in the first embodiment.

The operations when the complementary boundary-scan cell arrangement of the first embodiment thus constructed is in respective modes will now be described with reference to FIG. 2 showing the relationship between operation contents at the time of respective modes and control signals Mode, P/S, Shift/Load.

(i) The case of normal operation mode

The control signal Mode is caused to be at logic "0" level. Thus, normal operation is carried out irrespective of other control signals P/S, Shift/Load. For example, at complementary boundary-scan cell 21, signals inputted from input terminal Signal-Xlin and Signal-Ylin are delivered to multiplexers 212 and 222, and are outputted from output terminals Signal-Xlout and Signal-Ylout, respectively. As stated above, in respective complementary boundary-scan cells 21 to 2n, there results the state where input terminals Signal-Xlin to Signal-Xnin and Signal-Ylin to Signal Ynin, and output terminals Signal-Xlout to Signal-Xnout and Signal-Ylout to Signal-Ynout are respectively connected. Thus, respective signals inputted from the exterior are outputted from the boundary-scan cells to the exterior.

(ii) The case of test mode

When test is conducted, the control signal Mode is caused to be at logic "1" level. Thus, e.g., in complementary boundary-scan cell 21, multiplexers 212 and 222 are operative so that when this control signal Mode is given, they are supplied with signals outputted from multiplexers 217 and 227 to output them from output terminal Signal-Xlout and Signal-Ylout, respectively. Also in the complementary boundary-scan cell of the second stage and complementary boundary-scan cells of stages succeeding thereto 22 to 2n, operations similar to the above will be carried out.

(ii-i) The case of parallel mode

In such cases that no fault exists and signals can be outputted in parallel, a boundary-scan path of the own system is used. Namely, respective elements are connected so that signal lines with respect to boundary-scan path Scan-L of boundary Scan paths Scan-L and Scan-M are Signal-X1, Signal-X2, ..., Signal-Xn, and signal lines with respect to boundary-scan path Scan-M are Signal-Y1, Signal-Y2, ..., Signal-Yn. The control signal P/S is caused to be at logic "0" level.

(ii-i-i) At the time of load mode

When the complementary boundary-scan cell arrangement is in load mode, the control signal Shift-/Load is caused to be at logic "0" level. In the complementary boundary-scan cell 21, a signal inputted from input terminal Signal-Xlin is inputted to input terminal of multiplexer 216 of Scan-L system, and a signal inputted from input terminal Signal-Ylin is inputted to input terminal of multiplexer 226 of Scan-M system.

Signals outputted from multiplexers 216 and 226 are inputted to multiplexers 211 and 221 because the control signal Shift/Load is at logic "0" level, and are outputted to scan registers 213 and 223, respectively. In the scan registers 213 and 223, signals inputted to D-type flip-flops 214 and 224 are outputted in the state where they are held on the output nodes at the timing when Clock A is inputted.

Signals held on the output nodes of the D-type flip-flops 214 and 224 are respectively inputted to corresponding multiplexers of complementary boundary-scan cell 22 of the second stage, and signals on the output nodes of D-type flip-flops of the (n-1)-th stage are respectively inputted to multiplexers 271 and 281 of complementary boundary-scan cell 2n of the n-th stage. Signals inputted to multiplexers 271 and 281 are inputted to multiplexers 301 and 302 of boundary-scan path output switching section 30 through D-type flip-flops 273a and 283a, and are outputted from output terminals Scan-Lout and Scan-Mout to the exterior, respectively.

(ii-i-ii) At the time of shift mode

When the complementary boundary-scan cell arrangement is in the shift mode, the control signal Shift-/Load is caused to be at logic "1" level.

Signals held in scan registers of complementary boundary-scan cells 21 to 2(n-1) at the time of load mode (ii-i-i) are respectively inputted to multiplexers supplied with the control signal Shift/Load of logic "1" level of the complementary boundary-scan cell of the succeeding stage, and signals held in scan registers 273 and 283 of the complementary boundary-scan cell 2n of the final stage are inputted to multiplexers 301 and 302 of the boundary-scan cell output switching section 30. When clock signal is inputted to Clock A with this state being kept, signals held in scan registers of complementary boundary-scan cells 2(n-1) to 21 are sequentially transmitted from output terminals Scan-Lout and Scan-Mout to the exterior.

Further, in the boundary-scan path input switching section 10, signals inputted from input terminals Scan-Lin and Scan-Min are inputted, because the control signal P/S is at logic "0" level, to multiplexers 211 and 221 of the complementary boundary-scan cell 21 of the first stage through multiplexers 101 and 102, respectively.

Multiplexers 211 and 221 supplied with control signal Shift/Load of logic "1" level and supplied with signals outputted from multiplexers 101 and 102 deliver these signals to scan registers 213 and 223.

In the scan registers 213 and 223, those signals are delivered to D-type flip-flops 214 and 224, and are held on respective output nodes when Clock A is inputted.

Signals held on the output nodes of the D-type flip-flops 214 and 224 are inputted to corresponding multiplexers of complementary boundary-scan cell of the second stage and complementary boundary-scan cells succeeding thereto, and are then inputted to multiplexers 271 and 281 of the complementary boundary-scan cell 2n of the n-th stage, respectively. Signals inputted to multiplexers 271 and 281 are held on the output nodes of D-type flip-flops 273a and 283a, respectively.

In scan registers of respective complementary boundary-scan cells, signals are outputted in synchronism with the timing when Clock B is inputted. When complementary boundary-scan cell of the first stage is taken as an example, signals thus outputted are outputted from output terminals Signal-Xlout and Signal-Ylout to the exterior through multiplexers 217 and 227, and multiplexers 212 and 222, respectively. Similarly also in the complementary boundary-scan cell of the complementary boundary-scan cell of the second stage to the complementary boundary-scan cell of the n-th stage, respective input terminals Signal-Xiin are connected to output terminals Signal-Xiout through respective elements of Scan-L system, and respective input terminals Signal-Yiin are connected to output terminals Signal-Yiout through respective elements of Scan-M system.

(ii-ii) The case of single mode

In the case where a fault exists and signals cannot be transferred in parallel, an element of any other system is substituted for the faulty system, and signals are transferred in single mode.

For signal lines with respect to boundary-scan path Scan-L, Signal-Y1, Signal-Y2, . . . , Signal-Yn are substituted. For signal lines with respect to boundary-scan path Scan-M, Signal-X1, Signal-X2, . . . , Signal-Xn are substituted. At this time, the control signal P/S is caused to be at logic "1" level.

(ii-ii-i) At the time of load mode

When the complementary boundary-scan cell arrangement is in load mode, the control signal Shift-/Load is at logic "0" level.

Further, because control signal P/S is at logic "1" level, in the complementary boundary-scan cell 21, a signal inputted from input terminal Signal-Xlin is inputted to multiplexer 226 of Scan-M system, and a signal inputted from input terminal Signal-Ylin is inputted to multiplexer 216 of Scan-L system.

Signals outputted from the multiplexers 226 and 216 are inputted to multiplexers 221 and 211 because the control signal Shift/Load is at logic "0" level, and are outputted to scan registers 223 and 213, respectively. At scan registers 223 and 213, signals inputted to the D-type flip-flops 224 and 214 are outputted to multiplexers 25 and 215 at the timing when Clock A is inputted.

Signals held on the output nodes of the D-type flip-flops 224 and 214 are respectively inputted to corresponding multiplexers of the complementary boundary-scan cell 22 of the second stage, and signals held on the output nodes of D-type flip-flops of the (n-1)-th stage are inputted to multiplexers 281 and 271 of the complementary boundary-scan cell 2n of the n-th stage. Further, signals inputted to multiplexers 281 and 271 are inputted to boundary-scan path output switching section 30 through multiplexers 283a and 273a.

In the boundary-scan path output switching section 30, signals outputted from D-type flip-flops 283a and 273a are inputted to multiplexers 301 and 302 supplied with control signal P/S of logic "1" level, and are outputted from output terminals Scan-Lout and Scan-Mout to the exterior, respectively.

(ii-ii-ii) At the time of shift mode

When the complementary boundary-scan cell arrangement is in shift mode, the control signal Shift-/Load is caused to be at logic "1" level.

Signals held in scan registers of complementary boundary-scan cells 21 to 2(n-1) at the time of load mode (ii-ii-i) are respectively inputted to multiplexers supplied with the control signal Shift/Load of logic "1" level of the complementary boundary-scan cell of the succeeding stage, and signals held in scan registers 283 and 273 of the complementary boundary-scan cell 2n of the final stage are inputted to multiplexers 301 and 302 of the boundary-scan cell output switching section 30. When a clock signal is inputted to Clock A with this state being kept, signals held in scan registers of complementary boundary-scan cells 2(n-1) to 21 are sequentially outputted from output terminals Scan-Lout and Scan-Mout to the exterior, respectively.

Further, in the boundary-scan path input switching section 10, signals inputted from input terminals Scan-Lin and Scan-Min are inputted, because control signal P/S is at logic "1" level, to multiplexers 221 and 211 of the complementary boundary-scan cell 21 of the first stage through multiplexers 102 and 101 of other systems, respectively.

Multiplexers 221 and 211 supplied with the control signal Shift/Load of logic "1" level and supplied with signals outputted from multiplexers 102 and 101 deliver these signals to scan registers 223 and 213, respectively.

In the scan registers 223 and 213, those signals are delivered to D-type flip-flops 224 and 214, and are held on respective output nodes when Clock A is inputted.

Signals held on output nodes of the D-type flip-flops 224 and 214 are sequentially inputted to multiplexers of the complementary boundary-scan cell 22 of the second stage and complementary boundary-scan cells of stages succeeding thereto, and are inputted to multiplexers 281 and 271 of the complementary boundary-scan cell 2n of the n-th stage. The signals inputted to the multiplexers 281 and 271 are inputted to D-type flip-flops 283a and 273a, and are held on the output nodes.

In respective scan registers of complementary boundary-scan cells 21 to 2n, signals are respectively outputted at the timing when Clock B is inputted.

When complementary boundary-scan cell 21 is taken as an example, signals outputted from D-type flip-flops 225 and 215 are respectively outputted to multiplexers 212 and 222 through multiplexers 217 and 227 supplied with control signal P/S of logic "1" level. Thus, the signal inputted from input terminal Signal Xlin is outputted from output terminal Signal-Xlout of Scan-L system which is the own system, and the signal inputted from input terminal Signal-Ylin is outputted from Signal-Ylout of Scan-M system to the exterior.

Similarly in the complementary boundary-scan cell 22 of the second stage to complementary boundary-scan cell 2n of the n-th stage, after signals inputted from respective input terminals Signal-Xiin are transferred through respective elements of the other Scan-M system, they are outputted from output terminal Signal-Xiout of the own Scan-L system. Further, after signals inputted from respective input terminals Signal-Yiin are transferred through respective elements of Scan-L system, they are outputted from output terminal Signal-Yiout of the own Scan-M system to the exterior.

As stated above, in accordance with the first embodiment, in such cases that there is any fault in one of two systems, logic level of the control signal P/S is switched to thereby substitute boundary-scan path of the other system therefor, thus making it possible to transfer signals in single mode. Thus, also in the case where there is any stuck fault in the boundary-scan cell, when an internal logic circuit to be tested is normal, reasonable test results can be obtained without judging it as defective.

Figure 3:
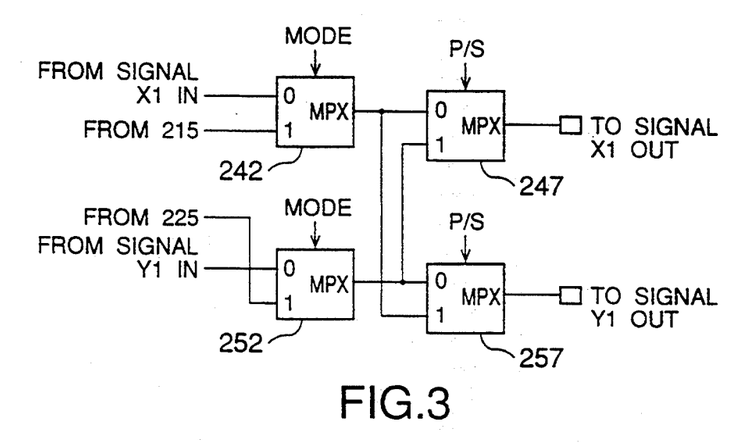
FIG. 3 is a circuit diagram showing the configuration in the case where the signal output section in the first embodiment is replaced by another circuit.

It is to be noted, in this embodiment shown in FIG. 1, signal output section 240 constituted with multiplexers 217 and 227, and 212 and 222 in the complementary boundary-scan cell 21 may be replaced by multiplexers 247 and 257, and 242 and 252 shown in FIG. 3.

The multiplexers 242 and 252 are supplied, when the control signal Mode is inputted, with signals inputted from any one of input terminals Signal-Xlin and Signal-Ylin and multiplexers 215 and 225. Further, the multiplexers 247 and 257 are supplied, when the control signal P/S is inputted, with signals outputted from any one of multiplexers 242 and 257 to output them to output terminal Signal-Xlout and Signal-Ylout. In addition, signal output sections of the complementary boundary-scan cell 22 of the second stage to the complementary boundary-scan cell 2n of the n-th stage may be similarly replaced.

Figure 4:
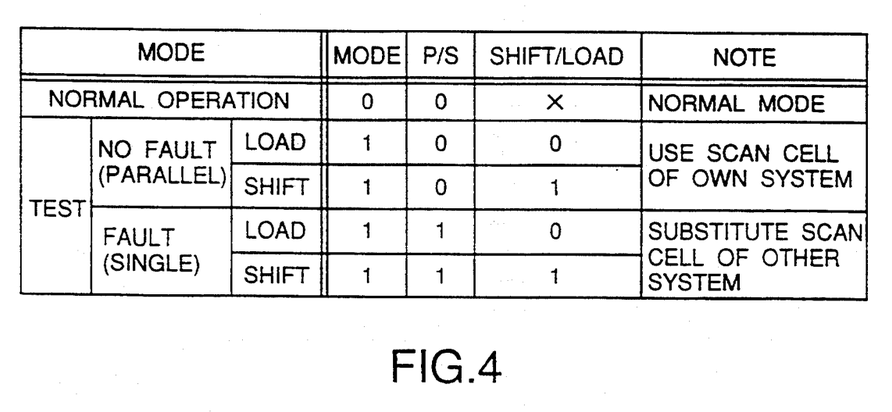
FIG. 4 is an explanatory view showing the relationship between operation modes and logic levels of respective control signals in the case where the signal output section in the first embodiment is replaced by the circuit shown in FIG. 3.

It is to be noted that, as shown in FIG. 4, this case differs from the first embodiment in that control signal P/S must be caused to be at logic "0" level in a normal operation. Other operation contents are the same as those of the first embodiment.

Figure 5:
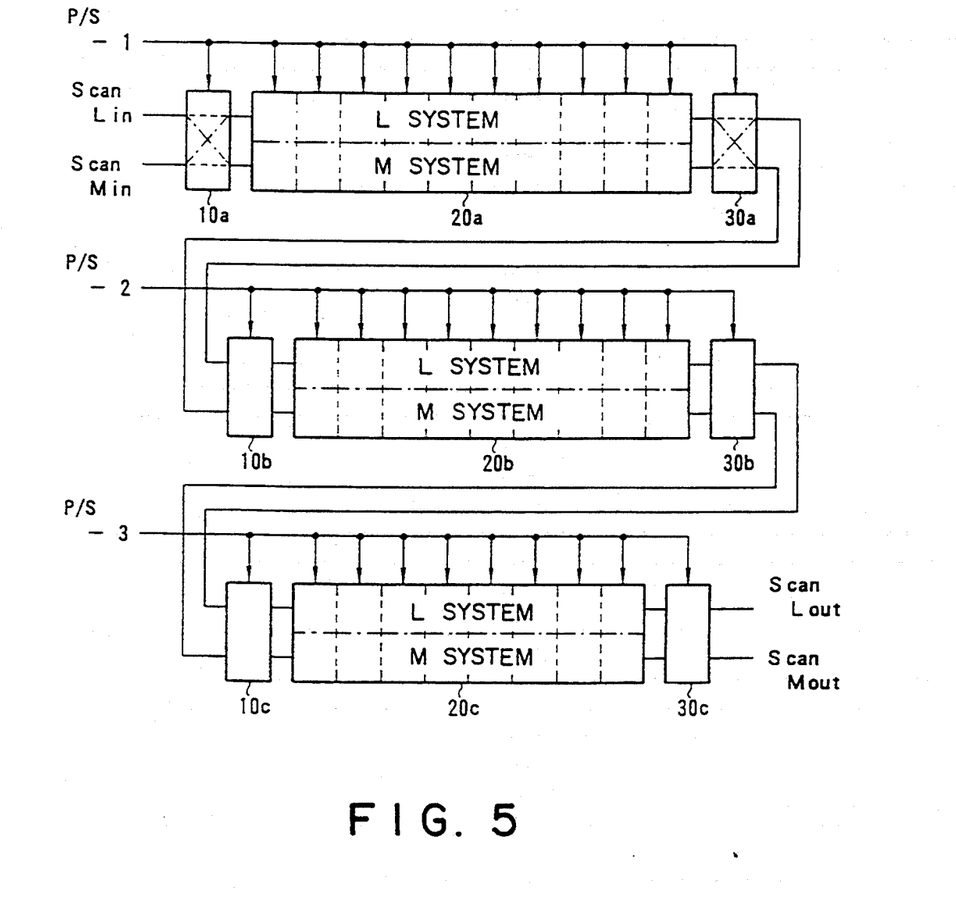
FIG. 5 is a block diagram showing the configuration in the case where three stages of complementary boundary-connected; scan cells according to the first embodiment are connected.

Further, plural blocks of complementary boundary-scan cells according to the first embodiment may be connected. In FIG. 5, the configuration in the case where three blocks of complementary boundary-scan cells are provided is shown. Namely, between input terminals Scan-Lin and Scan-Min and output terminals Scan Lout and Scan Mout, there are connected in series a complementary boundary-scan cell including a boundary-scan path input switching section 10a, a group of complementary boundary-scan cells 20a and a boundary-scan path output switching section 30a; a complementary boundary-scan cell including a boundary-scan path input switching section 10b, a group of complementary boundary-scan cells 20b, and a boundary-scan path output switching section 30b; and a complementary boundary-scan cell including a boundary-scan path input switching section 10c, a group of complementary boundary-scan cells 20c, and a boundary-scan path output switching section 30c.

By delivering control signals P/S-1, P/S-2 and P/S-3 different every respective blocks, it is possible to select the parallel mode or the single mode in dependency upon presence or absence of fault every block.

Figure 6:
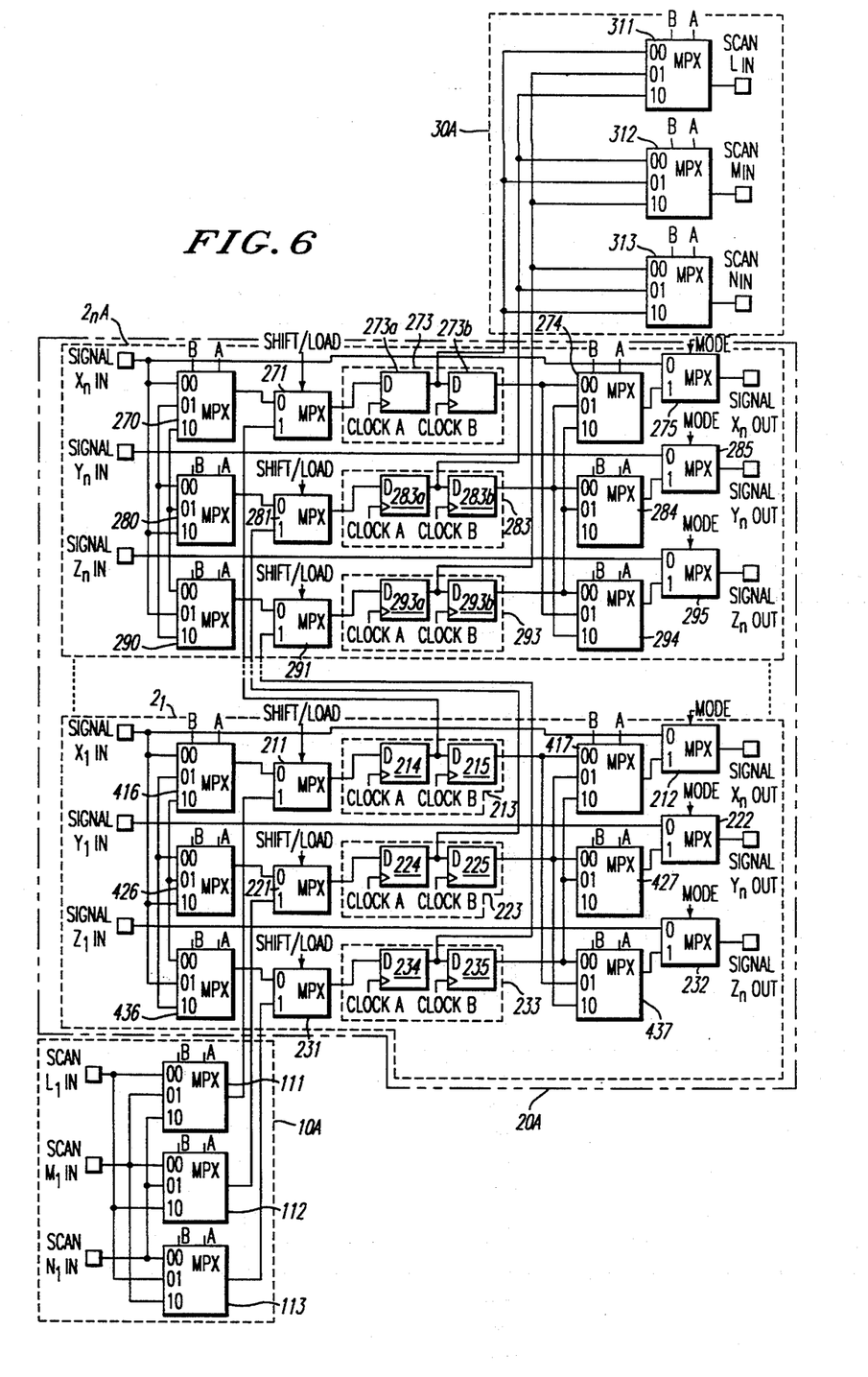
FIG. 6 is a circuit diagram showing the configuration of a complementary boundary-scan cell according to a second embodiment of this invention.

A complementary boundary-scan cell arrangement according to a second embodiment of this invention will now be described with reference to FIG. 6. The second embodiment differs from the first embodiment in that three systems of boundary-scan paths Scan-L, Scan-M and Scan-N are provided within the same chip. Boundary scan paths Scan-L are signal lines connecting input terminals Signal-Xlin, Signal-X2in, . . . , Signal-Xnin and output terminals Signal-Xlout, Signal-X2out, . . . , Signal-Xnout; boundary-scan paths Scan-M are signal lines connecting input terminals Signal-Ylin, Signal-Y2in, . . . ; Signal-Ynin and output terminals Signal-Ylout, Signal-Y2out, . . . , Signal-Ynout; and boundary-scan paths Scan-N are signal lines connecting input terminals Signal-Zlin, Signal-Z2in, . . . , Signal-Znin and output terminals Signal-Zlout, Signal-Z2out, . . . , Signal Znout.

As the result of the fact that three systems of boundary-scan paths are provided, control signals A and B of two bits are used so as to permit selection of any one of these systems.

Boundary scan path input switching section 10A include multiplexers 111, 112 and 113 so that respective data from boundary-scan path input terminals Scan-Lin, Scan-Min and Scan-Nin of three systems are inputted thereto and are outputted therefrom.

Figure 7:
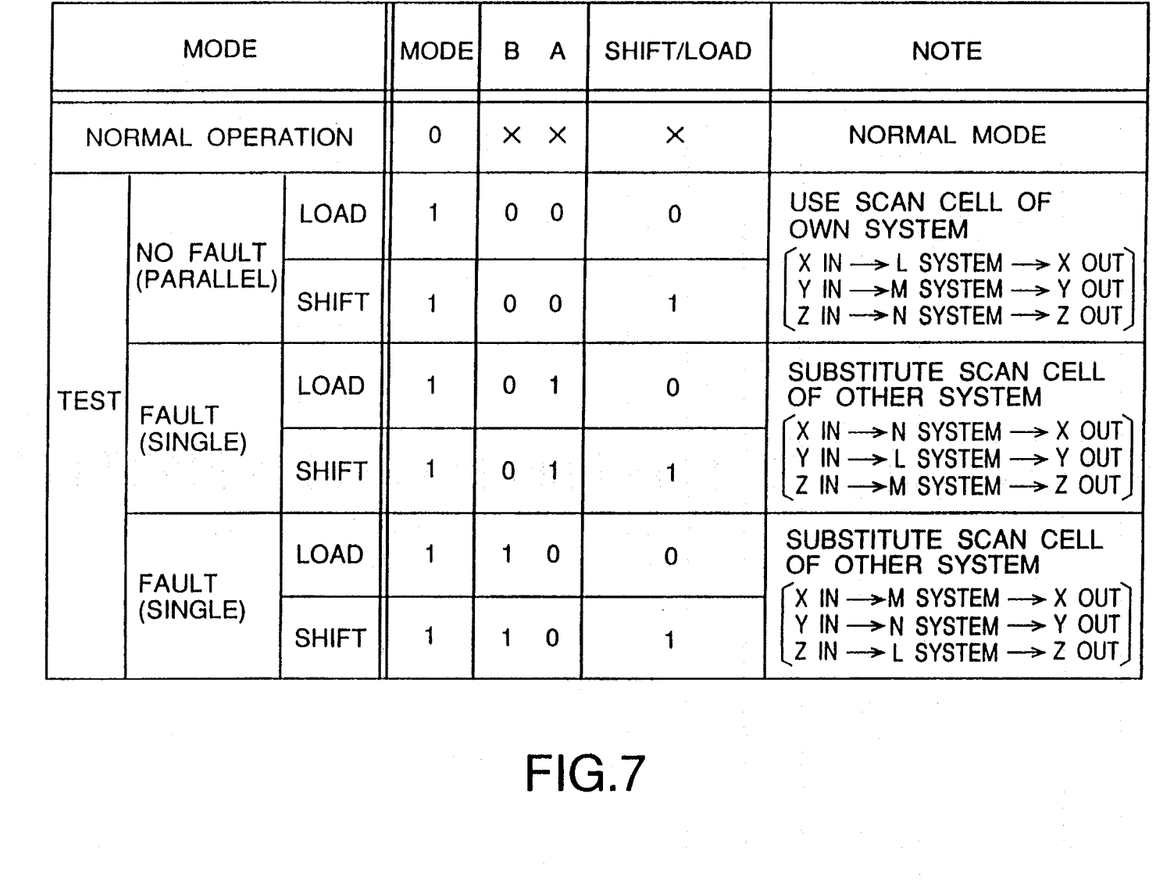
FIG. 7 is an explanatory view showing the relationship between operation modes and logic levels of respective control signals in the second embodiment.

When control signals A and B which both indicate logic "0" level are given, respective multiplexers operate as follows. Namely, as shown in FIG. 7, multiplexer 111 is supplied with data inputted from boundary-scan path input terminal Scan-Lin to output it; multiplexer 112 is supplied with data inputted from boundary-scan path input terminal Scan-Min to output it; and multiplexer 113 is supplied with data inputted from boundary-scan path input terminal Scan-Nin to output it. Data outputted from multiplexers 111, 112 and 113 are respectively delivered to multiplexers 211, 221 and 231 that complementary boundary-scan cell 21A of the complementary boundary-scan cell group 20A has.

On the contrary, when control signal A of logic "1" level and control signal B of logic "0" level are respectively delivered to multiplexers 111, 112 and 113, multiplexer 111 is supplied with data inputted from boundary-scan path input terminal Scan-Min to output it; multiplexer 112 is supplied with data inputted from boundary-scan path input terminal Scan-Nin to output it; and multiplexer 113 is supplied with data inputted from boundary-scan path input terminal Scan-Lin to output it.

The complementary boundary-scan cell group 20A includes n number of complementary boundary-scan cells 21A to 2nA of the same structure.

In this second embodiment, in order to cause the complementary boundary-scan cell arrangement to correspond to three systems of boundary-scan paths, signal lines Signal-X1, Signal-X2, . . . , Signal-Xn are provided with respect to boundary-scan path Scan-L, signal lines Signal-Y1, Signal-Y2, . . . , Signal-Yn are provided with respect to boundary-scan path Scan-M, and signal lines Signal-Z1, Signal-Z2, . . . , Signal-Zn are provided with respect to boundary-scan path Scan-N.

The complementary boundary-scan cell 21A comprises, between input terminals Signal-Xin, Signal-Yin and Signal-Zin and output terminals Signal-Xlout, Signal-Ylout and Signal-Zlout of three systems, multiplexers 416, 426 and 436, and 211, 221 and 231, a scan register 213 comprised of D-type flip-flops 214 and 215; a scan register 223 comprised of D-type flip-flops 224 and 225, a scan register 233 comprised of D-type flip-flops 234 and 235, and multiplexers 417, 427 and 437, and 212, 222 and 232.

Among these circuit components, multiplexers 416, 426 and 436 and multiplexers 417, 427 and 437 carry out selective switching of boundary-scan paths Scan-L, Scan-M and Scan-N of three systems in dependency upon levels of control signals A and B.

The complementary boundary-scan cell of the second stage to the complementary boundary-scan cell of the n-th stage 22A to 2nA similarly include such configuration. Output nodes of multiplexers 214, 224 and 234 of the complementary boundary-scan cell 21A are connected to scan registers of the complementary boundary-scan cell of the second stage to the complementary boundary-scan cell of the n-th stage 22A to 2nA. Output nodes of D-type flip-flops 273a, 283a and 293a of scan registers 273, 283 and 293 of the complementary boundary-scan cell 2nA are respectively connected to one input terminal of multiplexers 311, 312 and 313 of the boundary-scan path output switching section 30A.

The multiplexers 311, 312 and 313 are operative so that when control signals A and B which are both at logic "0" level are inputted, they are respectively supplied with signals outputted from multiplexers 273a, 283a and 293a of the complementary boundary-scan cell 2nA; when control signal A of logic "1" level and control signal B of logic "0" level are inputted, they are respectively supplied with signals outputted from multiplexers 293a, 273a and 283a; and when control signal A of logic "0" level and control signal B of logic "1" level are inputted, they are respectively supplied with signals outputted from multiplexers 283a, 293a and 273a.

The operations at the time of respective modes in the second embodiment as described above are as follows. The complementary boundary-scan cell arrangement of this embodiment similarly operates except that the number of systems is increased by one as compared to the above-described first embodiment.

(i) The case of normal operation mode

Similarly to the second embodiment, control signal Mode is at logic "0" level, and normal operation is performed irrespective of other control signals A, B and Shift/Load.

(ii) The case of test mode

When a test is conducted, the control signal Mode is caused to be at logic "1" level.

(ii-i) The case of parallel mode

When no fault exists, transfer of signals is carried out in parallel mode. Namely, respective elements are connected so that signal lines with respect to boundary-scan path Scan-L of boundary-scan paths Scan-L, Scan-M and Scan-N are Signal-X1, Signal-X2, ..., Signal-Xn; signal lines with respect to boundary-scan path Scan-M are Signal-Y1, Signal-Y2, ..., Signal-Yn; and signal lines with respect to boundary-scan path Scan-N are Signal-Z1, Signal-Z2, ..., Signal-Zn. In this case, control signals A and B are caused to be both at logic "0" level.

(ii-i-i) At the time of load mode

When the complementary boundary-scan cell arrangement is in load mode, the control signal Shift-/Load is at logic "0" level. In the complementary boundary-scan cell 21A, a signal inputted from input terminal Signal-Xlin is inputted to multiplexer 416 of Scan-L system, a signal inputted from input terminal Signal-Ylin is inputted to multiplexer 426 of Scan-M system, and a signal inputted from input terminal Signal-Zlin is inputted to multiplexer 436 of Scan-N system.

Signals outputted from multiplexers 416, 426 and 436 are inputted to multiplexers 211, 221 and 231, and are then outputted to scan registers 213, 223 and 233, respectively. At scan registers 213, 223 and 233, signals are outputted from D-type flip-flops 214, 224 and 234 in accordance with Clock A, and are then held on the output nodes.

Signals held on the output nodes of these D-type flip-flops 214, 224 and 234 are inputted to multiplexers of the second stage of complementary boundary-scan cell 22A. Signals held on output nodes of the (n-1)-th stage of D-type flip-flop are inputted to multiplexers 271, 281 and 291 of the n-th stage of complementary boundary scan cell 2nA, and are inputted to D-type flip-flops 273a, 283a and 293a, respectively. Signals inputted to D-type flip-flops 273a, 283a and 293a of the n-th stage of complementary boundary-scan cell 2nA are inputted to multiplexers 311, 312 and 313 of boundary-scan path output switching section 30A, and are outputted from output terminals Scan-Lout, Scan-Mout and Scan-Nout to the exterior.

(ii-i-ii) At the time of shift mode

At the time of shift mode, the control signal Shift-/Load is at logic "1" level.

Signals held in the scan registers of complementary boundary-scan cells 21A to 2(n-1)A at the time of load mode (ii-i-i) are respectively inputted to multiplexers supplied with the control signal Shift/Load of logic "1" level of the complementary boundary-scan cell of the succeeding stage. Signals held in scan registers 273a, 283a and 293a of the final stage- of complementary boundary-scan cell 2nA are inputted to multiplexers 311, 312 and 313 of boundary-scan cell output switching section 30A. When clock signal is inputted to Clock A with this state being kept, signals held in the scan registers of complementary boundary-scan cells 2(n-1)A to 21A are sequentially outputted from output terminals Scan-Lout, Scan-Mout and Scan-Nout to the exterior.

Further, in the boundary-scan path input switching section 10A, signals inputted from input terminals Scan-Lin, Scan-Min and Scan-Nin are inputted, because control signals A and B are both at logic "0" level, to multiplexers 211, 221 and 231 of the first stage of complementary boundary-scan cell 21A through multiplexers 111, 112 and 113, respectively. These multiplexers 211, 221 and 231 deliver these signals to scan registers 213, 223 and 233. In the scan registers 213, 223 and 233, those signals are delivered to D-type flip-flops 214, 224 and 234, and are held on output nodes when Clock A is inputted, respectively.

Signals held on the output nodes of D-type flip-flops 214, 224 and 234 are sequentially inputted to the second to the n-th stages of complementary boundary-scan cells 22A to 2nA. Thus, these signals are inputted to D-type flip-flops 273a, 283a and 293a of the n-th stage of complementary scan cell 2nA, and are placed in the state where they are held on output nodes.

In respective complementary boundary-scan cells 21A to 2nA, signals are outputted in synchronism with the timing when clock B is inputted. When the first stage of complementary boundary-scan cell 21A is taken as an example, signals respectively outputted from D-type flip-flops 215, 225 and 235 are outputted from output terminals Signal-Xlout, Signal-Ylout and Signal-Zlout to the exterior through multiplexers 417, 427 and 437 and multiplexers 212, 222 and 232. Similarly in the second to the n-th stages of complementary boundary-scan cells 22A to 2nA, respective input terminals Signal-Xiin are connected to output terminals Signal-Xiout through respective elements of Scan-L system, respective input terminals Signal-Yiin are connected to output terminals Signal-Yiout through respective elements of Scan-M system, and respective input terminals Signal-Ziin are connected to output terminals Signal-Ziout through respective elements of Scan-N system.

(ii-ii) The case of single mode

In the case where any fault exists, signals cannot be transferred by connecting respective elements of the own system, path of any other system is substituted and signals are transferred in single mode. Since three systems exist in the second embodiment, it is possible to select any one of two kinds of systems in the case where any other system is substituted.

When control signal A is at logic "1" level and control signal B is at logic "0" level, Signal-Y1, Signal-Y2, ..., Signal-Yn are substituted as signal lines with respect to boundary-scan path Scan-L, Signal-Z1, Signal-Z2, ..., Signal-Zn are substituted as signal lines with respect to boundary-scan path Scan-M, and Signal-X1, Signal-X2, ..., Signal-Xn are substituted as signal lines with respect to boundary-scan path Scan-N.

When control signal A is at logic "0" level and control signal B is at logic "1" level, Signal-Z1, Signal-Z2, ..., Signal-Zn are substituted as signal lines with respect to boundary-scan path Scan-L, Signal-X1, Signal-X2, ..., Signal-Xn are substituted as signals with respect to boundary-scan path Scan-M, and Signal-Y1, Signal-Y2, ... Signal-Yn are substituted as signal lines with respect to boundary-scan path Scan-N.

(ii-ii-i) At the time of load mode

At the time of load mode, the control signal Shift-/Load is at logic "0" level.

When control signal A is at logic "1" level and control signal B is at logic "0" level, the operation in the complementary boundary-scan cell 21A is as follows. A signal inputted from input terminal Signal-Xlin is inputted to input terminal of multiplexer 436 of Scan-N system, a signal inputted from input terminal Signal-Ylin is inputted to input terminal of multiplexer 416 of Scan-L system, and a signal inputted from input terminal Signal-Zlin is inputted to input terminal of multiplexer 426 of Scan-M system.

Signals outputted from multiplexers 416, 426 and 436 are inputted to scan registers 213, 223 and 233 as described above, and are outputted in accordance with Clock A and are held on output nodes.

Signals held on output nodes of D-type flip-flops 234, 214 and 224 are inputted to multiplexers of the second stage of complementary boundary-scan cell. Signals held on output nodes of the (n-1)-th stage of D-type flip-flops are respectively inputted to multiplexers 291, 271 and 281 of the n-th stage of complementary boundary-scan cell 2nA. In addition, signals inputted to multiplexers 291, 271 and 281 of the n-th stage of complementary boundary-scan cell 2nA are held on output nodes of D-type flip-flops 293a, 273a and 283a.

The signals held on the output nodes of the D-type flip-flops 293a, 273a and 283a are inputted to multiplexers 311, 312 and 313 of boundary-scan path output switching section 31A, and are outputted from output terminals Scan-Lin, Scan-Min and Scan-Nin.

(ii-ii-ii) At the time of shift mode

At the time of shift mode, the control signal Shift-/Load is caused to be at logic "1" level.

Signals held in the scan registers of complementary boundary-scan cells 21A to 2(n-1)A at the time of load mode (ii-ii-i) are respectively inputted to multiplexers supplied with the control signal Shift/Load of logic "1" level of the complementary boundary-scan cell of the succeeding stage. Signals held in scan registers 293a, 273a and 283a of the final stage of complementary boundary-scan cell 2nA are inputted to multiplexers 311, 312 and 313 of boundary-scan cell output switching section 30A. When clock signal is inputted to Clock A with this state being kept, signals held in scan registers of complementary boundary-scan cells 2(n-1)A to 21A are sequentially outputted from output terminals Scan-Lout, Scan-Mout and Scan-Nout of the own respective systems to the exterior.

Further, in the boundary-scan path input switching section 10A, signals inputted from input terminals Scan-Lin, Scan-Min and Scan-Nin are inputted, because control signal A is at logic "1" level and control signal B is at logic "0" level, to multiplexers 231, 211 and 221 of the first stage of complementary boundary-scan cell 21A through multiplexers 113, 111 and 112 of other systems, respectively. These multiplexers 231, 211 and 221 deliver these signals to scan registers 233, 213 and 223. In the scan registers 233, 213 and 223, those signals are delivered to D-type flip-flops 234, 214 and 224, and are respectively held on output nodes when Clock A is inputted.

The signals held on the output nodes of D-type flip-flops 234, 214 and 224 are sequentially inputted to multiplexers of the second to the n-th stages of complementary boundary-scan cells 22A to 2nA, and are held on output nodes of D-type flip-flops 293a, 273a and 283a through multiplexers 291, 271 and 281 of the n-th stage of complementary boundary-scan cell 2nA.

Thereafter, when the first stage of complementary boundary-scan cell 21A is taken as an example, signals are outputted in accordance with the timing when Clock B is inputted to D-type flip-flops 235, 215 and 225, and are respectively outputted to multiplexers 212, 222 and 232 through multiplexers 417, 427 and 437 supplied with control signal A of logic "1" level and control signal B of logic "0" level. Thus, signals inputted from input terminals Signal-Xlin, Signal-Ylin and Signal-Zlin are finally outputted from output terminals Signal-Xlout, Signal-Ylout and Signal-Zlout of the own systems, respectively.

Similarly also in the complementary boundary-scan cell 22A of the second stage to the complementary boundary-scan cell 2nA of the n-th stage, after signals inputted from respective input terminals Signal-Xiin are transferred through respective elements of other Scan-N system, they are outputted from output terminal Signal-Xiout of the own Scan-L system. Further, after signals inputted from respective input terminals Signal-Yiin are transferred through respective elements of Scan-L system, they are outputted from output terminal Signal-Yiout of the own Scan-M system to the exterior. In addition, after signals inputted from respective input terminals Signal-Ziin are transferred through elements of Scan-M system, they are outputted from output terminal Signal Ziout of the own Scan-N system to the exterior.

The operations when control signal A is at logic "1" level and control signal B is at logic "0" level in the case where the boundary-scan cell arrangement is in the load mode and in the shift mode have been described above. When control signal A is at logic "0" level and control signal B is at logic "1" level, signal lines Signal-Z1, Signal-Z2, ..., Signal-Zn are substituted with respect to boundary-scan path Scan-L; signal lines Signal-X1, Signal-X2, ..., Signal-Xn are substituted with respect to boundary-scan path Scan-M; and signal lines Signal-Y1, Signal-Y2, ..., Signal-Yn are substituted with respect to boundary-scan path Scan-N. Since the operation in this case is the same except for the above, its explanation is omitted here.

As stated above, in accordance with the second embodiment, in such cases that one or two of three systems are faulty, an approach is employed to switch logic levels of control signals A and B, thereby making it possible to transfer signals with a boundary-scan path of any other system which is not faulty being substituted therefor. Thus, even in the case where there is any stuck fault in the boundary-scan cell, if the internal logic circuit to be tested is normal, it is possible to obtain reasonable test result without judging it as defective.

Figure 8:
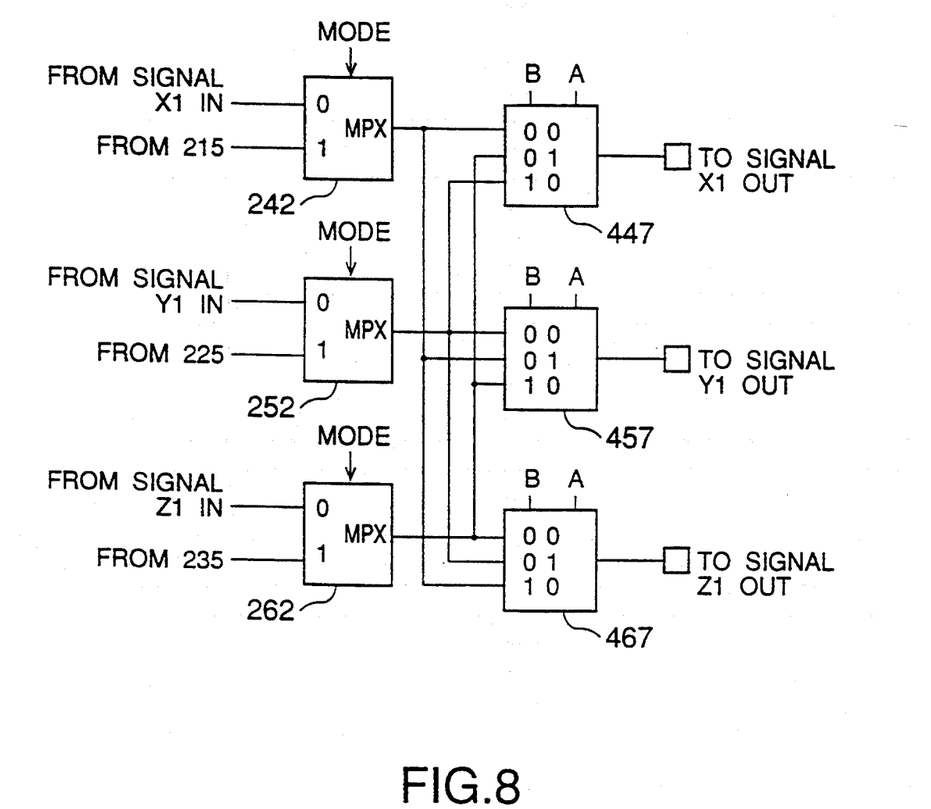
FIG. 8 is a circuit diagram showing the configuration in the case where the signal output section in the second embodiment is replaced by another circuit.

It is to be noted that signal output section 240A constituted with multiplexers 417, 427, 437, 212, 222 and 232 in the complementary boundary-scan cell 21A may be replaced by multiplexers 242, 252, 262, 447, 457 and 467 shown in FIG. 8.

The multiplexers 242, 252 and 262 are supplied with signals from any one of input terminals Signal-Xlin, Signal-Ylin and Signal-Zlin and multiplexers 215, 225 and 235 in accordance with the level of control signal Mode. Further, the multiplexers 447, 457 and 467 are supplied with signals outputted from any one of multiplexers 242, 252 and 262 in accordance with combination of logic levels of control signals A and B to output them to output terminals Signal-Xlout, Signal-Ylout and Signal-Zlout. Signal output sections in the complementary boundary-scan cell 22A of the second stage to the complementary boundary-scan cell 2nA of the n-th stage may be similarly replaced.

Figure 9:
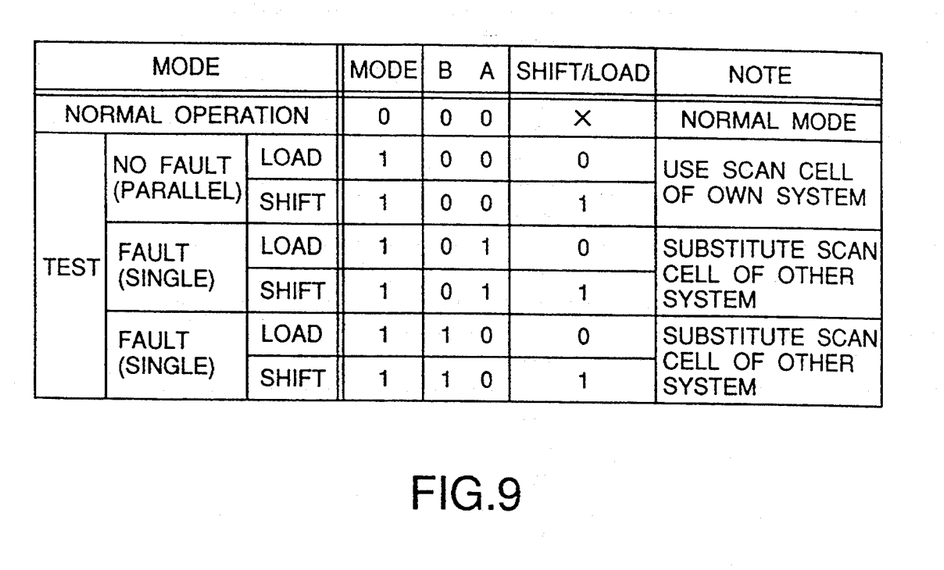
FIG. 9 is an explanatory view showing the relationship between operation modes and logic levels of respective control signals in the case where the signal output section in the second embodiment is replaced by the circuit shown in FIG. 8.

In the case where signal output section is replaced by the circuit of FIG. 8, control signals A and B must be caused to be both at logic "0" level in normal operation as shown in FIG. 9.

Also with respect to the complementary boundary-scan cell according to the second embodiment, a plurality of blocks may be connected as explained with reference to FIG. 5 in connection with the first embodiment. In this case, an approach is employed to deliver control signals A-1 and B-1, A-2 and B-2, and A-3 and B-3 different every respective blocks, thereby making it possible to select a path of the own system or any other system in dependency upon presence or absence of fault every block.

It should be noted that the above-described embodiments are all presented only for illustrative purpose, but do not limit this invention in any sense. For example, while two systems of boundary-scan paths are provided in the first embodiment and three systems of boundary-scan paths are provided in the second embodiment, four systems or more may be provided.

What is claimed is:

1. A complementary boundary-scan cell comprising:

m (m is an integer equal to 2 or more) number of system input terminals adapted so that signals are inputted from the system side thereto;

m number of scan input terminals adapted so that signals are inputted thereto for scan;

m number of registers supplied with the signals inputted to said system input terminals or said scan input terminals and adapted for holding the signals;

m number of system output terminals supplied with the signals held by said registers and adapted for outputting the signals to the system side;

m number of scan output terminals supplied with the signals held by said registers and adapted for outputting the signals for scan;

m number of first multiplexers having m number of input terminals and an output terminal, and capable of switching the connection relationship between the input terminals of said first multiplexers and said system input terminals;

m number of second multiplexers having m number of input terminals and an output terminal, and capable of switching the connection relationship between the input terminals of said second multiplexers and said system input terminals;

m number of third multiplexers having two input terminals and an output terminal, the output terminal of said third multiplexers is connected to an input terminal of a corresponding register of said registers, and capable of switching the connection relationship between the output terminal of said first multiplexers, the output terminal of said second multiplexers and the output terminal of said third multiplexers;

m number of fourth multiplexers provided between said registers and said system output terminals, and capable of switching the connection relationship between said registers, said system input terminal, and said system output terminal; and m number of fifth multiplexers provided between said registers and said scan output terminals, and capable of switching the connection relationship between said registers and said scan output terminal;

m number of paths connecting said system input terminals, said first multiplexers, said third multiplexers, said registers, said fifth multiplexers, and said scan output terminals being permitted to be arbitrarily switched, m number of paths connecting said scan input terminals, said second multiplexers, said third multiplexers, said registers, said fourth multiplexers, and said system output terminals being permitted to be arbitrarily switched.

2. A complementary boundary-scan cell comprising:

a first system input terminal adapted so that a first signal is inputted thereto;

a second system input terminal adapted so that a second signal is inputted thereto;

a first multiplexer having input terminals respectively connected to said first and second system input terminals;

a second multiplexer having input terminals respectively connected to said first and second system input terminals;

a first scan input terminal adapted so that said first signal is inputted thereto;

a second scan input terminal adapted so that said second signal is inputted thereto;

a third multiplexer having input terminals respectively connected to said first and second scan input terminals;

a fourth multiplexer having input terminals respectively connected to said first and second scan input terminals;

a fifth multiplexer having input terminals respectively connected to output terminals of said first and third multiplexers;

a sixth multiplexer having input terminals respectively connected to output terminals of said second and fourth multiplexers;

a first scan register having an input terminal connected to an output terminal of said fifth multiplexer, a first output terminal, and a second output terminal, and supplied with a signal outputted from said fifth multiplexer and adapted for holding the signal to output the signal from said first output terminal or said second output terminal;

a second scan register having an input terminal connected to an output terminal of said sixth multiplexer, a third output terminal, and a fourth output terminal, and supplied with a signal outputted from said sixth multiplexer and adapted for holding the signal to output the signal from said third output terminal or said fourth output terminal;

a seventh multiplexer having input terminals respectively connected to the first terminal of said first scan register and the third output terminal of said second scan register;

an eighth multiplexer having input terminals respectively connected to the first terminal of said first scan register and the third output terminal of said second scan register;

a ninth multiplexer having input terminals respectively connected to said first system input terminal and an output terminal of said seventh multiplexer;

a tenth multiplexer having input terminals respectively connected to said second system input terminal and an output terminal of said eighth multiplexer;

an eleventh multiplexer having input terminals respectively connected to the second terminal of said first scan register and the fourth terminal of said second scan register; and a twelfth multiplexer having input terminals respectively connected to the second terminal of said first scan register and the fourth terminal of said second scan register, wherein when the complementary boundary-scan cell is in a parallel mode and in a load mode, said first signal inputted from said first system input terminal is inputted to said first scan register through said first and fifth multiplexers and is held therein, whereupon the signal thus held is outputted from said second terminal and is outputted through said eleventh multiplexer; and said second signal inputted from said second system input terminal is inputted to said second scan register through said second and sixth multiplexers and is held therein, whereupon the signal thus held is outputted from said fourth terminal and is outputted through said twelfth multiplexer, wherein when said complementary boundary-scan cell is in the parallel mode and in a shift mode, said fist signal inputted from said first scan input terminal is inputted to said first scan register through said third and fifth multiplexers and is held therein, whereupon the signal thus held is outputted through said seventh and ninth multiplexers; and said second signal inputted from said second scan input terminal is inputted to said second scan register through said fourth and sixth multiplexers and is held therein, whereupon the signal thus held is outputted through said eighth and tenth multiplexers, wherein when said complementary boundary-scan cell is in a single mode and in the load mode, said first signal inputted from said first system input terminal is inputted to said second scan register through said second and sixth multiplexers and is held therein, whereupon the signal thus held is outputted from said fourth terminal and is outputted through said eleventh multiplexer; and said second signal inputted from said second system input terminal is inputted to said first scan register through said first and fifth multiplexers and is held therein, whereupon the signal thus held is outputted from said second output terminal and is outputted through said twelfth multiplexer, and wherein when said complementary boundary-scan cell is in the single mode and in the shift mode, said first signal inputted from said first scan input terminal is inputted to said second scan register through said fourth and sixth multiplexers and is held therein, whereupon the signal thus held is outputted through said seventh and ninth multiplexers; and said second signal inputted from said second scan input terminal is inputted to said first scan register through said third and fifth multiplexers and is held therein, whereupon the signal thus held is outputted through said eighth and tenth multiplexers.

3. A complementary boundary-scan cell including n (n is an integer equal to 2 or more) stages of boundary-scan cells, each of said boundary-scan cells comprising:

a first system input terminal adapted so that a first signal is inputted thereto;

a second system input terminal adapted so that a second signal is inputted thereto;

a first multiplexer having input terminals respectively connected to said first and second system input terminals;

a second multiplexer having input terminals respectively connected to said first and second system input terminals;

a fifth multiplexer having two input terminals, one of which is connected to an output terminal of said first multiplexer;

a sixth multiplexer having two input terminals, one of which is connected to an output terminal of said second multiplexer;

a first scan register connected to an output terminal of said fifth multiplexer, a first output terminal and a second output terminal, and supplied with a signal outputted from said fifth multiplexer and adapted for holding the signal to output the signal from said first output terminal or said second output terminal;

a second scan register connected to an output terminal of said sixth multiplexer, a third output terminal, and a fourth output terminal, and supplied with a signal outputted from said sixth multiplexer and adapted for holding the signal to output the signal from said third output terminal or said fourth output terminal;

a seventh multiplexer having input terminals respectively connected to the first terminal of said first scan register and the third output terminal of said second scan register;

an eighth multiplexer having input terminals respectively connected to the first terminal of said first scan register and the third output terminal of said second scan register;

a ninth multiplexer having input terminals respectively connected to said first system input terminal and an output terminal of said seventh multiplexer; and a tenth multiplexer having input terminals respectively connected to said second system input terminal and an output terminal of said eighth multiplexer;

wherein the second output terminals of the first scan registers of the boundary-scan cell of the preceding stage are respectively connected to the other input terminals of the fifth multiplexers of the boundary-scan cells of the succeeding stage, the fourth output terminals of the second scan registers of the boundary-scan cell of the preceding stage are respectively connected to the other input terminals of the sixth multiplexers of the boundary-scan cell of the succeeding stage, said complementary boundary-scan cell further comprising:
- a boundary-scan path input switching section including;
- a first scan input terminal adapted so that said first signal is inputted thereto;
- a second scan input terminal adapted so that said second signal is inputted thereto;
- a third multiplexer having input terminals respectively connected to said first and second scan input terminals, and an output terminal connected to the other input terminal of the fifth multiplexer that the boundary-scan cell of the first stage has, and
- a fourth multiplexer having input terminals respectively connected to said first and second scan input terminals, and an output terminal connected to the other input terminal of the sixth multiplexer that said boundary-scan cell of the first stage has, and
- a boundary-scan path output switching section including;
- an eleventh multiplexer having input terminals respectively connected to the second terminal of the first scan register and the fourth terminal of the second scan register that the boundary-scan cell of the n-th stage has, and
- a twelfth multiplexer having input terminals respectively connected to said second terminal of said first scan register and said fourth terminal of said second scan register that said boundary-scan cell of the n-th stage has, wherein when said complementary boundary-scan cell is in a parallel mode and in a load mode, in each of said boundary-scan cells, said first signal inputted from said first system input terminal is inputted to said first scan register through said first and fifth multiplexers and is held therein, whereupon the signal thus held is outputted from said second terminal, and, upon switching from the load mode to a shift mode while maintaining the parallel mode, that signal is inputted to the first scan registers through the fifth multiplexers of the boundary-scan cell of the succeeding stage to the boundary-scan cell of the n-th stage, and is held therein, whereupon the signal thus held is outputted from the second output terminal, and is outputted through said eleventh multiplexer from the second terminal of the first scan register of the n-th stage; and when the complementary boundary-scan cell is similarly in the parallel mode and in the load mode, said second signal inputted from said second system input terminal is inputted to said second register through said second and sixth multiplexers and is held therein, whereupon the signal thus held is outputted from said fourth terminal, and, upon switching from the load mode to the shift mode while maintaining the parallel mode, that signal is inputted to the second scan registers through the sixth multiplexers of the boundary-scan cell of the succeeding stage to the boundary-scan cell of the n-th stage, and is held therein, whereupon the signal thus held is outputted from fourth terminal, and is outputted through the twelfth multiplexer from said fourth terminal of said second scan register of the n-th stage, wherein when said complementary boundary-scan cell is in the parallel mode and in the shift mode, said first signal inputted from said first scan input terminal is delivered to said fifth multiplexer that the boundary-scan cell of the first stage has through said third multiplexer, is further inputted to said first scan register, and is held therein, whereupon the signal thus held is outputted from said second terminal, is delivered to the fifth multiplexers that the boundary-scan cell of the succeeding stage to the boundary-scan cell of the nth stage have, is inputted to said first scan register, is held therein, and is outputted through said seventh and ninth multiplexers in each of said boundary-scan cells; and said second signal inputted from said second scan input terminal is delivered to said sixth multiplexer that the boundary-scan cell of the first stage has through said fourth multiplexer, is further inputted to said second scan register, and is held therein, whereupon the signal thus held is outputted from said fourth terminal, is delivered to the sixth multiplexers in the boundary-scan cell of the succeeding stage to the boundary-scan cell of the n-th stage, is inputted to said second scan register, is held therein, and is outputted from the eighth and tenth multiplexers in each of said boundary-scan cells, wherein when the complementary boundary-scan cell is in a single mode and in the load mode in each of said boundary-scan cells said first signal inputted from said first system input terminal is inputted to said second scan register through said second and sixth multiplexer, and is held therein, whereupon the signal thus held is outputted from said fourth terminal, and, upon switching from the load mode to the shift mode while maintaining the single mode, that signal is inputted to the second scan registers through the sixth multiplexers of the boundary-scan cell of the succeeding stage to the boundary-scan cell of the n-th stage, and is held therein, whereupon the signal thus held is outputted from said fourth terminal and is outputted through said twelfth multiplexer from said fourth terminal of said second scan register of the n-th stage; and when said complementary boundary-scan cell is similarly in the single mode and in the load mode, said second signal inputted from said second system input terminal is inputted to said first scan register through said first and fifth multiplexers, and is held therein, whereupon the signal thus held is outputted from said second terminal, upon switching from the load mode to the shift mode while maintaining the single mode, that signal in inputted to the first scan registers through the fifth multiplexers of the boundary-scan sell of the succeeding stage to the boundary-scan cell of the n-th stage, and is held therein, whereupon the signal thus held is outputted from said second terminal, and is outputted through said eleventh multiplexer from said second terminal of said first register of the n-th stage, and wherein when said complementary boundary-scan cell is in the single mode and in the shift mode, said first signal inputted from said first scan input terminal is delivered to said sixth multiplexer that the boundary-scan cell of the first stage has through said fourth multiplexer, is further inputted to said second scan register, and is held therein, whereupon the signal thus held is outputted from said fourth terminal is delivered to the sixth multiplexers that the boundary-scan cell of the succeeding stage to the boundary-scan cell of the nth stage have, is inputted to said second scan register, is held therein, and is outputted through said seventh and ninth multiplexers in each of said boundary-scan cells; and said second signal inputted from said second scan input terminal is delivered to said fifth multiplexer that the boundary-scan cell of the first stage has through said third multiplexer, is further inputted to said first scan register and is held therein, where upon the signal thus held is outputted from said second terminal, is delivered to the fifth multiplexers in the boundary-scan cell of the succeeding stage to the boundary-scan cell of the n-th stage, is inputted to said first scan register, is held therein, and is outputted from the eighth and tenth multiplexers in each of said boundary-scan cells.

4. A complementary boundary-scan cell as set forth in claim 3, wherein there are provided a plurality of boundary-scan cell blocks each comprising said n stages of boundary-scan cells, said boundary-scan path input switching section, and said boundary-scan path output switching section, thus making it possible to arbitrarily select either said parallel mode or said single mode every respective blocks.

5. A complementary boundary-scan cell as set forth in claim 3,
wherein said first scan register includes a first D-type flip-flop which has a data input terminal connected to the output terminal of said fifth multiplexer, is-driven in response to a first clock inputted thereto, and has a data output terminal connected to said first terminal; and a second D-type flip-flop which has a data input terminal connected to said first terminal, is driven in response to a second clock inputted thereto, and has a data output terminal connected to said second terminal, and
wherein said second scan register includes a third D-type flip-flop which has a data input terminal connected to the output terminal of said sixth multiplexer, is driven in response to the first clock inputted thereto, and has a data output terminal connected to said third terminal; and a fourth D-type flip-flop which has a data input terminal connected to said third terminal, is driven in response to the second clock inputted thereto, and has a data output terminal connected to said fourth terminal.

* * * * *